(12) United States Patent
Op 't Eynde et al.

(10) Patent No.: US 9,385,745 B1
(45) Date of Patent: Jul. 5, 2016

(54) SIGMA-DELTA ADC WITH DITHER

(71) Applicant: MediaTek Inc., Hsin-Chu (TW)

(72) Inventors: Frank Op 't Eynde, Wilsele (BE);
 Chi-Lun Lo, Taoyuan County (TW);
 Michael A. Ashburn, Groton, MA (US)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/842,353

(22) Filed: Sep. 1, 2015

Related U.S. Application Data

(60) Provisional application No. 62/162,245, filed on May 15, 2015, provisional application No. 62/103,182, filed on Jan. 14, 2015.

(51) Int. Cl.
 *H03M 1/20* (2006.01)
 *H03M 3/00* (2006.01)
 *H03M 1/00* (2006.01)
 *H03M 1/12* (2006.01)
 *H03M 1/06* (2006.01)

(52) U.S. Cl.
 CPC .............. *H03M 3/328* (2013.01); *H03M 3/458* (2013.01); *H03M 1/00* (2013.01); *H03M 1/0641* (2013.01); *H03M 1/12* (2013.01)

(58) Field of Classification Search
 CPC ........ H03M 1/0641; H03M 1/00; H03M 1/12
 USPC .......................... 341/131, 118, 155, 156, 120
 See application file for complete search history.

(56) References Cited

U.S. PATENT DOCUMENTS

2012/0194369 A1   8/2012 Galton et al.
2013/0249720 A1*  9/2013 Matsuura ............ H03M 1/1038
                                                    341/118

OTHER PUBLICATIONS

Badzmirowski, K. et al., "Effectiveness of Various Dithering Architectures for Linearisation of High-resolution Oversampling A/D Converters," IEEE Advanced A/D and D/A Conversion Techniques and their Applications, Jul. 27-28, 1999, pp. 175-178, Conference Publication No. 466.
Candy, J., "A Use of Limit Cycle Oscillations to Obtain Robust Analog-to-Digital Converters," IEEE Transactions on Communications, Mar. 1974, pp. 298-305, vol. COM-22, No. 3.
Chou, W., et al., "Dithering and Its Effects on Sigma-Delta and Multistage Sigma-Delta Modulation," IEEE Transactions on Information Theory, May 1991, pp. 500-513, vol. 37, No. 3.
Friedman, V., "The Structure of the Limit Cycles in Sigma Delta Modulation," IEEE Transactions on Communications, Aug. 1988, pp. 972-979, vol. 36, No. 8.
Norsworthy, S. R., "Effective Dithering of Sigma-Delta Modulators," IEEE International Symposium on Circuits and Systems, ISCAS 1992, pp. 1304-1307.
Temes, G. C., et al., "A Tutorial Discussion of the Oversampling Method for A/D and D/A Conversion", IEEE International Symposium on Circuits and Systems, ISCAS 1990, pp. 910-913.

* cited by examiner

*Primary Examiner* — Joseph Lauture
(74) *Attorney, Agent, or Firm* — Wolf, Greenfield & Sacks, P.C.

(57) ABSTRACT

Systems and methods for reducing spurious noise tones in sigma-delta analog-to-digital converters (ADCs) are described. A dither signal may be added to two differential input signals of a pseudo-differential sigma-delta ADC. The dither signal may be generated by a pseudo-random bit sequence generator and applied to two input buffers, which add the dither signal to received differential analog input signals. The dithered signals may be digitized by two independent sigma-delta ADCs and then subtracted to remove the dither signal from an overall digital output signal.

20 Claims, 4 Drawing Sheets

SIGMA-DELTA ADC WITH DITHER

RELATED APPLICATIONS

This application claims the benefit of U.S. provisional Application Ser. No. 62/103,182, titled "Sigma-Delta ADC with Dither," filed on Jan. 14, 2015 and to U.S. provisional Application Ser. No. 62/162,245 of the same title, filed on May 15, 2015. The entire disclosure of the foregoing applications are incorporated herein by reference.

BACKGROUND

1. Technical Field

The technology relates to circuits, systems, and methods for differential conversion of analog to digital signals.

2. Discussion of the Related Art

Analog-to-digital converters (ADCs) are widely used in various electronic apparatus and systems such as mobile phones, audio equipment, image-capture devices, video equipment, wireline communications systems, sensors and measurement equipment, and radar systems, among other applications. A typical ADC is an electronic circuit configured to receive an analog signal, which typically is a time-varying signal, repeatedly sample the analog signal at discrete time intervals, and output a digital signal (e.g., a bit sequence or digital word) for each sampled time interval that is representative of a value of the analog signal during the sampling interval. Because the output of an ADC is an N-bit sequence, the analog signal is discretized into a number $M=2^N$ of integer values. The number N is referred to as the bit resolution of the ADC. For example, if a single-ended ADC is an 8-bit device, then an input signal can be discretized into $2^N=256$ values (0, 1, 2, 3 . . . 255). For an ideal ADC, the output bit value will be linearly proportional to the sampled analog signal value over a full input voltage range that is accepted by the ADC.

There are several types of conventional ADCs, and they may be divided into two groups: ADCs with single-bit quantization (e.g., a comparator) and ADCs with multi-bit quantization (e.g., N-bit ADCs). Multibit quantizing ADCs may include voltage-controlled-oscillator (VCO)-based ADCs, sigma-delta ADCs, successive-approximation-register ADCs, flash ADCs, among others. The multibit, sigma-delta ADCs are finding increasing use in wireless and wireline communication systems. Although these types of ADCs are slower than flash ADCs, for example, they are capable of very high bit resolution and high conversion accuracy. A potential problem with a sigma-delta ADC is that its sigma-delta modulator can introduce spurious noise tones into their output due to nonlinear limit-cycle oscillations inside the modulator loop. These noise tones can lead to conversion errors.

SUMMARY

Circuits, systems, and methods associated with reducing noise tones in sigma-delta ADCs are described. The inventors have recognized and appreciated that a filtered dither signal can be introduced into two signal paths of a differential, sigma-delta ADC to disrupt periodic limit-cycle oscillations in sigma-delta modulators and reduce the spurious noise tones from the converter. Signals output from the two signal paths can be subtracted to essentially remove the filtered dither signal from the digital output signal.

According to some embodiments, a differential analog-to-digital converter (ADC) may comprise a differential analog input that includes a first signal input terminal and a second signal input terminal. A first ADC may be connected to the first input terminal in a first signal path, and a second ADC may be connected to the second input terminal in a second signal path. The differential ADC may further comprise a dither input terminal configured to receive a dither signal, and a filter configured to filter the dither signal. An output from the filter may be coupled to both the first and second signal paths so that the filtered dither signal dithers output signals from the first ADC and second ADC by essentially equal amounts.

Methods of operating a differential ADC are also included. In some embodiments, a method for converting analog to digital signals may comprise acts of receiving, at a first input terminal, a first analog signal, receiving, at a second input terminal, a second analog signal, and dithering the first analog signal and the second analog signal by approximately the same amount. Embodied methods may further include applying the dithered first analog signal to a first ADC, applying the dithered second analog signal to a second ADC, taking the difference of output signals from the first ADC and the second ADC, and providing the difference as a digital output signal representative of a difference between the first analog signal and second analog signal.

The foregoing apparatus and method embodiments may be included in any suitable combination with aspects, features, and acts described in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

Figure 1:
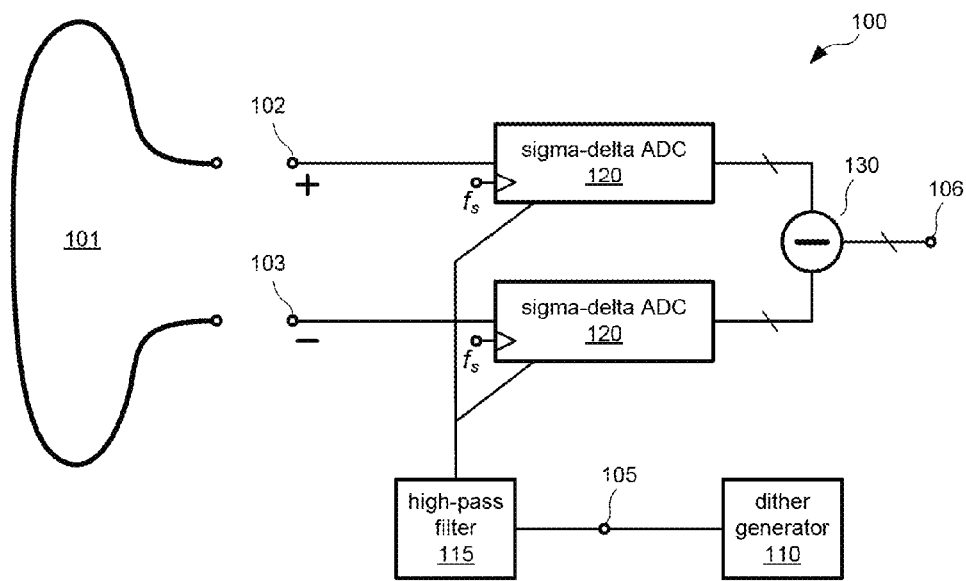
FIG. 1 depicts a pseudo-differential sigma-delta ADC, according to some embodiments.

The inventors have recognized and appreciated that the performance of multi-bit sigma-delta ADCs can be improved by reducing spurious noise tones introduced by the sigma-delta modulator. The inventors have recognized and appreciated that the noise tones can be reduced by adding a filtered dither signal to two inputs of a pseudo-differential sigma-delta ADC, such that the dither output can be essentially cancelled from the ADC output signal without requiring special filtering or additional circuitry to remove the dither signal at the ADC output. FIG. 1 depicts just one example of a sigma-delta ADC 100 in which a dither signal can be used to reduce spurious noise tones of the sigma-delta modulators.

Before describing the circuit of FIG. 1, it is helpful to describe three different types of circuit configurations: single-ended, fully-differential, and pseudo-differential. A single-ended circuit operates on an input signal, which may be time varying, that is referenced to another reference potential that is typically fixed or constant. In many cases, the reference potential is "ground", and conventionally represented as zero volts. A fully-differential circuit typically operates on an input signal that is carried by two wires or conductors to two input terminals of the circuit. The signal on both wires may be time varying, and the fully-differential circuit is designed to be sensitive to the difference between these two signals. However, essentially all internal signals of the circuit and also the output signal show only a little or zero sensitivity to common-mode values appearing on each input signal.

A pseudo-differential circuit also operates on an input signal that is carried by two wires or conductors to two input terminals of the circuit, where the signal on both wires may be time varying. The pseudo-differential circuit is also designed to be sensitive to the difference between these two signals, and its output signal is sensitive to the difference between these two input signals. The output signal has little or no sensitivity to the common-mode values of the two input signals. Unlike the fully-differential circuit, some or all internal signals in a pseudo-differential circuit may have considerable sensitivity to common-mode values. In some cases, a pseudo-differential circuit may consist of two independent sub-circuits, each operating on one of the two electrical input signals and each providing an output signal. Accordingly, each sub-circuit will be sensitive to common-mode values appearing at each circuit's input. The two output signals may then be differenced to obtain an overall output signal from the pseudo-differential circuit. Provided that the two sub-circuits are essentially identical and linear, the overall output signal is essentially insensitive to common-mode values of the two input signals.

The ADC 100 of FIG. 1 depicts a pseudo-differential circuit in which two signals output from two sigma-delta (ΣΔ) converters 120 are differenced to provide an overall digital output. According to some embodiments, a pseudo-differential ADC 100 comprises two analog signal input terminals 102, 103 connected to two differential circuit paths. Each circuit path includes a sigma-delta ADC 120 connected to receive a signal from a corresponding input terminal. A pseudo-differential ADC 100 may further comprise a digital differencing element 130 and an output terminal coupled to outputs of the ΣΔ converters 120. According to some implementations, a pseudo-differential ADC 100 may further comprise a high-pass filter 115 configured to filter a received dither signal that is applied to the ΣΔ converters. A pseudo-differential ADC 100 may, or may not, include a dither signal generator 110. In some cases, a dither signal may be received at a dither signal input terminal 105. In some embodiments, the pseudo-differential ADC 100 may be connected to two output terminals of a radio-frequency antenna 101 upstream. There may be an analog low-noise amplifier between the antenna 101 and ADC 100.

In operation, time varying signals may be received at input terminals 102, 103, and transmitted to respective inputs of the sigma-delta ADCs 120. The ΣΔ ADCs may receive a clocking signal to sample the input signals at a frequency $f_s$, and convert each sampled signal to a digital output signal. The ADCs may also receive a filtered dither signal from dither generator 110. The dither signal may be high-pass filtered with filter 115, so as to attenuate "in-band" frequency components that lie within the conversion band of the ΣΔ ADCs 120. According to some embodiments, the conversion band of the ADCs covers a range of frequencies from DC up to about one-half the sampling frequency $f_s$. The same filtered dither signal may be applied to both of the ΣΔ ADCs in a manner to vary the output signals from the ΣΔ ADCs by a small amount, e.g., between 2% and 10% of their nominal output value. The digital outputs from each ΣΔ ADC 120 may then be differenced (e.g., digitally subtracted) by differencing element 130, and the resulting difference provided as a converted digital output signal representative of a difference between the two analog input signals. By taking the difference of the output signals, the dither component is removed.

The dither signal applied to the sigma-delta ADCs may be a random signal (e.g., a signal derived from white noise), or a pseudo-random signal (e.g., a signal generated by a pseudo-random signal generator). In some implementations, the dither signal may comprise a swept frequency signal or a ramp signal. When applied directly to the ΣΔ ADCs, the dither signal may add to the analog signals before conversion, or add to integration values in modulator loops of the ΣΔ converters 120 (e.g., inject charge into an integrating capacitor in each modulator loop). By adding a small dither signal to the two converters 120, spurious noise tones associated with limit-cycle periodicity in the ΣΔ converters can be suppressed. As long as the same amount of dither is applied to each ΣΔ ADC circuit path and the two ADCs 120 respond in essentially the same way, subtraction of the signals by differencing element 130 will effectively remove the dither signal from the overall digital output signal, so that special filtering is not needed to remove the dither signals.

The inventors have recognized and appreciated that there are second-order effects that may cause incomplete cancellation of the dither signal from the digital output of the pseudo-differential ADC 100. For example, nonlinear intermodulation products can occur between an input signal and an applied dither signal in each circuit path. These intermodulation products can affect the digital signal value at the output of each ΣΔ converter 120. Because the intermodulation products are created by a nonlinear process, their amplitudes may not be the same for each converter 120. Therefore, their contributions to the outputs from the converters 120 may not cancel each other completely after subtraction by differencing element 130. Further, if the conversion gains of the two ΣΔ converters 120 are not exactly identical, their responses to the dither signal will differ slightly. As a result, the effects of dither may not cancel completely after subtraction.

To reduce residual dither signal components resulting from second-order effects, the inventors have recognized and appreciated that the dither signal can be filtered before being applied to each differential circuit path of the pseudo-differential ADC 100. In some embodiments, a filter 115 is configured as a high-pass filter that attenuates in-band frequencies of the applied dither signal between approximately 3 dB and 10 dB. A small amount of attenuation of in-band frequency components of the dither signal can appreciably reduce in-band intermodulation products, because the intermodulation products are produced by a nonlinear process. For example, attenuation of in-band frequency components of the dither signal by a factor of two can reduce corresponding intermodulation products by a factor of eight.

Figure 2:
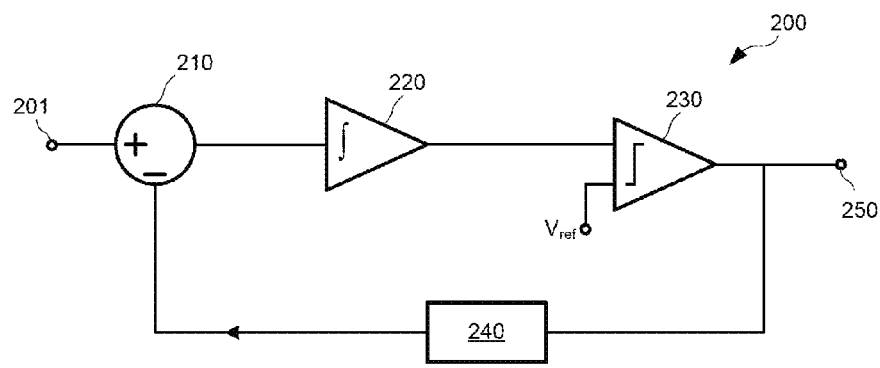
FIG. 2 depicts a modulator for a first-order sigma-delta converter, according to some embodiments.

In further detail and referring again to FIG. 1, each sigma-delta converter 120 may comprise analog and digital components integrated onto a semiconductor substrate. The two ΣΔ converters 120 may have a same structure, and may respond to an input signal in a same way (e.g., produce an output signal of essentially the same magnitude for a same input signal). One example of a modulator 200 for a first-order ΣΔ converter is depicted in FIG. 2. The illustrated example is for instructional purposes only, and is not intended to limit the structure of sigma-delta converters 120. The modulator 200 comprises the front end of a sigma-delta converter. It receives an analog signal at its input 201, and outputs a stream of pulses at its output 250. The first-order modulator loop comprises a summing node 210, and integrator 220, a comparator 230, and a 1-bit digital-to-analog converter (DAC) 240. The output is fed back through the DAC 240 and is subtracted from the input signal at summing node 210. The pulse stream from the output 250 may be sent to a counter (not shown), which counts the number of pulses during a sampling time interval to determine a digital signal level that corresponds to the sampled analog signal. Other types of sigma-delta converters 120 may include second-order and third-order sigma-delta converters. In some embodiments, the ADCs 120 may be voltage-controlled-oscillator-based ADC. In some cases, the outputs from the ADCs 120 may be single-ended outputs. Such converters may be used in a pseudo-differential ADC 100, and may have additional circuit components beyond what is shown in FIG. 2, as will be appreciated by one skilled in the art of analog-to-digital conversion.

The filter 115 may comprise an integrated, analog high-pass filter. Any suitable filter design may be used that attenuates in-band frequency components of a received signal relative to out-of-band frequency components. Filter 115 may comprise a combination of resistive and capacitive components, in some cases, and may be integrated onto a same substrate as the sigma-delta converters 120. In some embodiments, filter 115 may be a passive filter, while in other embodiments, filter 115 may be an active filter and comprise one or more transistors.

Differencing component 130 may comprise an integrated digital circuit configured to subtract a first received value from a second received value. For example, differencing component 130 may comprise a logic adder or an arithmetic logic unit (ALU) integrated onto a same substrate as the ΣΔ converters 120.

Dither generator 110 may comprise any suitable random or pseudo-random signal generator. In some embodiments, dither generator may provide amplified white noise as a dither signal. In some cases, dither generator may comprise a ramp or triangular wave generator or variable frequency source. A frequency of the dither signal may be varied deterministically, pseudo-randomly, or randomly in time. Circuitry for the dither generator 110 may be integrated on a same substrate as the ΣΔ converters 120, in some cases. In some embodiments, circuitry for dither generation may be located off-chip, and the ADC 100 may receive a dither signal at a dither input terminal 105.

Figure 3:
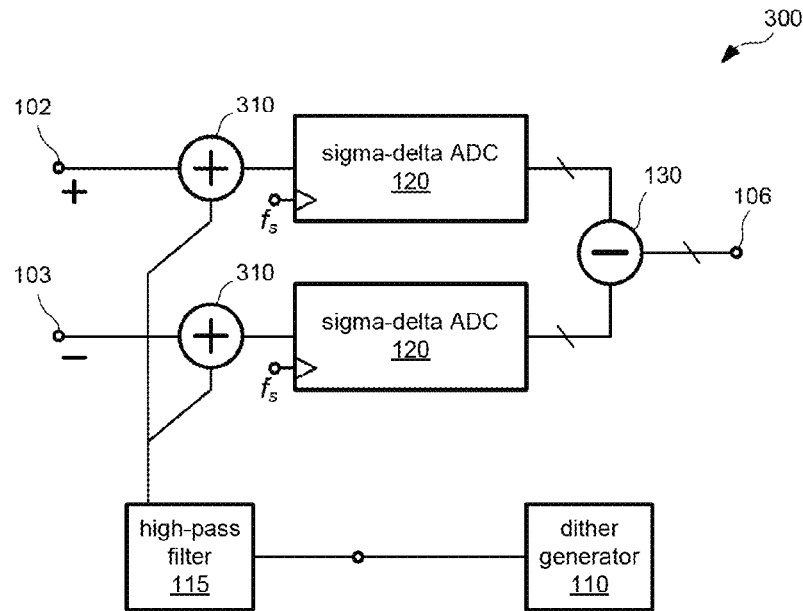
FIG. 3 depicts a pseudo-differential sigma-delta ADC, according to some embodiments.

Another embodiment of a pseudo-differential sigma-delta ADC 300 is depicted in FIG. 3. In this embodiment, a filtered dither signal may be added to input analog signals at summing circuits 310 in each of the two differential circuit paths. Other circuit components may be the same as described above in connection with FIG. 1. The summing circuits 310 may each comprise an analog summing amplifiers, according to some embodiments.

Figure 4:
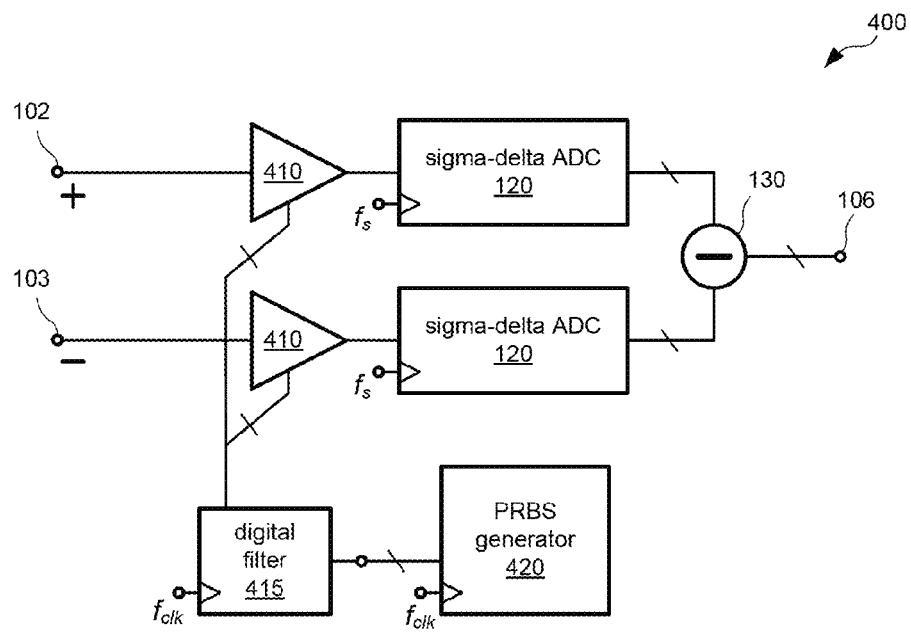
FIG. 4 depicts a pseudo-differential sigma-delta ADC, according to some embodiments.

FIG. 4 depicts a pseudo-differential sigma-delta ADC 400 that is configured to receive a pseudo-random bit sequence (PRBS) for dithering analog input signals. The ADC may comprise input buffers 410 in each differential analog input path and a digital filter 415 configured to filter a received PRBS. The PRBS may be generated by an on-chip PRBS generator 420, or by a PRBS generator or processor located off-chip. A PRBS generator 420 is configured to provide a sequence of N-bit words (N>1) having pseudo-randomized or randomized values. The PRBS generator and digital filter may be clocked at a clock frequency $f_{clk}$. According to some embodiments, the clock frequency $f_{clk}$ is less than one-half the ADC sampling frequency $f_s$.

According to some embodiments, digital filter 415 is configured to attenuate in-band frequency components of the PRBS dither signal relative to out-of-band frequency components. In some embodiments, digital filter 415 comprises a finite-impulse-response (FIR) high-pass filter, though other filter designs may be used in some cases. In some implementations, digital filter 415 has a transfer function H(z) with two zeros at DC: $H(z)=(1-z^{-1})^2$. Filtered digital values may then be provided to input buffers 410.

Figure 5A:
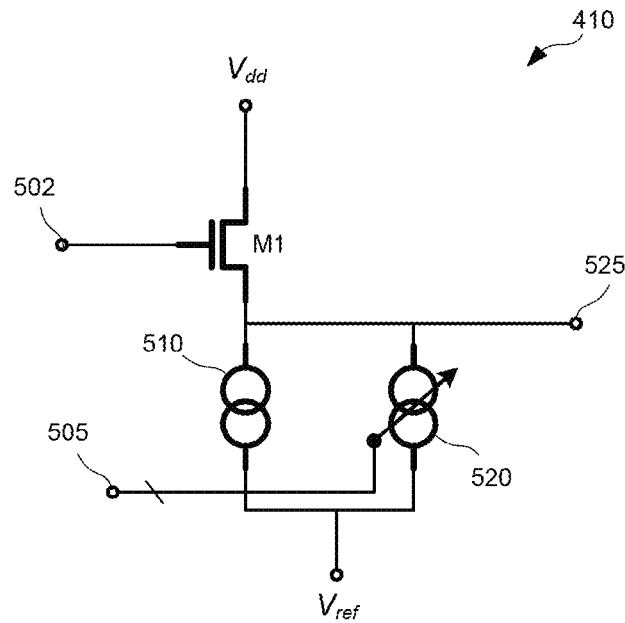
FIG. 5A depicts a buffer configured to add a dither signal to a received analog signal, according to some embodiments.

The input buffers may be configured to dither a received analog signal value by a small amount based upon digital values received from the digital filter 415. Subtraction at differencing element 130 essentially removes the dither signal from the overall output digital signal. One example of an input buffer 410 is depicted in FIG. 5A. In some implementations, the input buffer may be configured as a modified source follower. According to some embodiments, an input buffer 410 comprises a transistor M1 connected in series with a fixed current source 510 between a voltage supply $V_{dd}$ and a voltage reference $V_{ref}$. The voltage reference may be ground, in some implementations. The transistor M1 may be any type of transistor, e.g., a bipolar junction transistor, a junction field effect transistor, a metal-oxide-semiconductor field effect transistor, a fin field effect transistor, etc. and may be of either type (e.g., p-type or n-type). A control terminal 502 of the transistor may be connected to input terminal 102 and receive an analog input signal. An output terminal 525 of the buffer 410 may connect to a node between the transistor M1 and fixed current source 510. The input buffer 410 may further include a variable current source 520 connected in parallel with the fixed current source 510 between the output terminal 525 and reference potential $V_{ref}$. The variable current source 520 may be configured to receive an N-bit digital word that determines an amount of current provided by the variable current source.

For the input buffer 410 depicted in FIG. 5A, an amount of dither current $I_d$ provided by the variable current source 520 can be denoted as:

$$I_d = D \times I_o \qquad (1)$$

where D represents the value of the received N-bit word, and $I_o$ represents a minimum increment of current provided by the variable current source. From EQ. 1 the amount of dither signal ΔV added to output terminal 525 is approximately equal to:

$$\Delta V = -\frac{DI_o}{g_m} \quad (2)$$

where $g_m$ is the transconductance of the transistor M1. As long as the dither signal is added to both analog circuit paths equally and is later canceled by differencing component 130, the dither signal itself need not be a precision signal. Accordingly, the variable current source 520 can be constructed from simple analog circuit components (e.g., CMOS transistors and resistors).

Figure 5B:
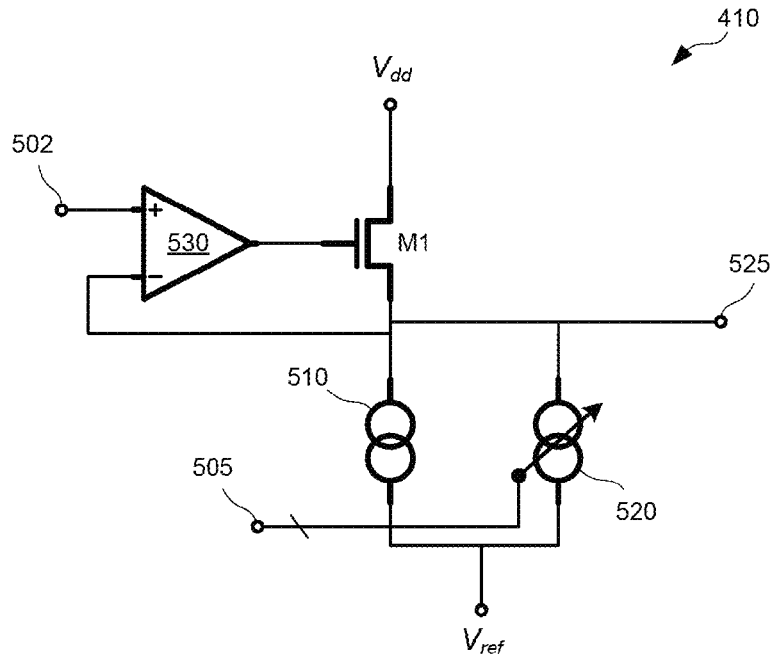
FIG. 5B depicts a buffer configured to add a dither signal to a received analog signal, according to some embodiments.

FIG. 5B illustrates another embodiment of an input buffer 410 configured to dither differential analog input signals of a pseudo-differential ADC 400. In some embodiments, an input buffer 410 may further include an amplifier 530 configured to have a gain A connected to provide feedback from the output terminal 525 to an inverting input of the amplifier. An analog signal may be applied to the non-inverting input terminal 502. With the amplifier 530 and feedback configuration of FIG. 5B, the amount of dither signal ΔV can be tuned. For this circuit configuration, the amount of dither signal ΔV added to output terminal 525 is approximately equal to:

$$\Delta V = -\frac{DI_o/g_m}{1+A} \quad (3)$$

This relationship shows that the amplitude of the dither signal can be tuned by adjusting the gain A of the amplifier. In some embodiments, the amplifier 530 may comprise an operational amplifier.

Figure 6:
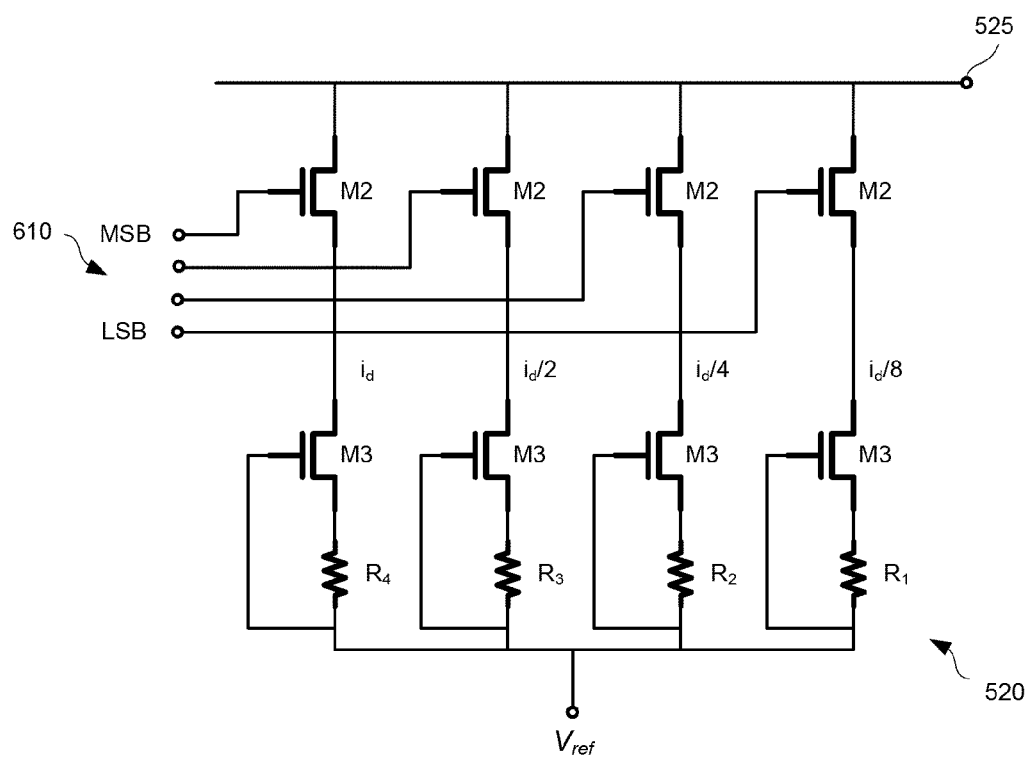
FIG. 6 depicts a digitally-controlled variable current source, according to some embodiments.

An example of a digitally-controlled variable current source 520 is depicted in FIG. 6, according to some embodiments. A variable current source may comprise a plurality of switching transistors M2, each connected in series with a fixed current source. Each fixed current source may comprise a transistor M3 connected in series with a resistor. The value of the resistor $R_n$ may vary for each fixed current source. For example, the value of each resistor may be selected so that the current flowing in each fixed current source is given by $i_o/2^m$ where m=0, 1, 2, 3, . . . . According to this circuit, a digital word received at a digital input 610 will selectively activate transistors M2 to provide a total current that is proportional to the value of the received digital word. Other embodiments of digitally controlled current sources may be used in some embodiments of input buffers 410.

CONCLUSION

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A differential analog-to-digital converter (ADC) comprising:
   a differential analog input comprising a first signal input terminal and a second signal input terminal;
   a first ADC connected to the first signal input terminal in a first signal path;
   a second ADC connected to the second signal input terminal in a second signal path;
   a dither input terminal configured to receive a dither signal; and
   a filter configured to filter the dither signal, wherein an output from the filter is coupled to both the first and second signal paths so that the output from the filter dithers output signals from the first ADC and second ADC.

2. The differential ADC of claim 1, wherein the first ADC has a same structure as the second ADC, such that the output signals from the first ADC and second ADC are dithered by essentially equal amounts.

3. The differential ADC of claim 2, wherein the first ADC is configured to respond to an input signal to produce a first output signal of approximately the same magnitude as a second output signal produced by the second ADC in response to the input signal.

4. The differential ADC of claim 1, wherein the first ADC and the second ADC comprise sigma-delta modulators.

5. The differential ADC of claim 1, wherein the first ADC and the second ADC are voltage-controlled-oscillator-based ADCs.

6. The differential ADC of claim 1, wherein outputs from the first ADC and the second ADC are each single-ended outputs.

7. The differential ADC of claim 1, wherein the first signal path is configured to couple to a first side of a receiving antenna and the second signal path is configured to couple to a second side of the receiving antenna.

8. The differential ADC of claim 1, wherein the filter is a high-pass filter configured to attenuate frequency components of the dither signal in a conversion band of the first ADC and second ADC.

9. The differential ADC of claim 1, wherein the filter is a digital finite-impulse-response high-pass filter configured to attenuate frequency components of the dither signal in a conversion band of the first ADC and second ADC.

10. The differential ADC of claim 1, further comprising:
    a first analog summing circuit in the first signal path configured to add the dither signal to an analog signal from the first signal input terminal; and
    a second analog summing circuit in the second signal path configured to add the dither signal to an analog signal from the second signal input terminal.

11. The differential ADC of claim 1, further comprising:
a first buffer in the first signal path configured to receive a digital dither signal and to receive an analog signal from the first signal input terminal; and
a second buffer in the second signal path configured to receive the digital dither signal and to receive an analog signal from the second signal input terminal.

12. The differential ADC of claim 11, wherein each buffer comprises:
a source follower circuit having a transistor connected in series with a first fixed current source; and
a variable current source connected in parallel with the fixed current source, wherein the variable current source is controllable with a digital word input.

13. The differential ADC of claim 11, wherein each buffer comprises:
a source follower circuit having a transistor connected in series with a first fixed current source;
an amplifier having an output connected to a control terminal of the transistor, a non-inverting input connected to one of the first and second signal input terminals, and an inverting input connected to a node between the transistor and fixed current source; and
a variable current source connected in parallel with the fixed current source, wherein the variable current source is controllable with a digital word input.

14. The differential ADC of claim 1, further comprising a differencing circuit element that is configured to receive a first output signal from the first ADC and a second output signal from the second ADC and output a digital output signal that comprises a difference between the first output signal and the second output signal.

15. The differential ADC of claim 1, wherein the differential ADC is a pseudo-differential circuit.

16. A method for converting analog to digital signals, the method comprising:
receiving, at a first input terminal, a first analog signal;
receiving, at a second input terminal, a second analog signal;
applying essentially a same amount of dither to the first analog signal and the second analog signal to produce a first dithered analog signal and second dithered analog signal;
applying the first dithered analog signal to a first ADC;
applying the second dithered analog signal to a second ADC; and
differencing output signals from the first ADC and the second ADC.

17. The method of claim 16, further comprising filtering a dither signal that is applied to dither the first analog signal and second analog signal, wherein the filtering comprises high-pass filtering to attenuate frequency components of the dither signal that are in conversion bands of the first ADC and second ADC.

18. The method of claim 17, wherein filtering the dither signal comprises filtering with a digital finite-impulse-response filter.

19. The method of claim 16, wherein applying essentially a same amount of dither comprises summing a same dither signal to the first analog signal and the second analog signal.

20. The method of claim 16, wherein applying essentially a same amount of dither comprises:
receiving the first analog signal at a first buffer;
receiving digital words at the first buffer;
modulating an output signal from the first buffer based on the digital words;
receiving the second analog signal at a second buffer;
receiving the same digital words at the second buffer; and
modulating an output signal from the second buffer based on the digital words.

* * * * *